United States Patent
Choi et al.

(10) Patent No.: US 9,453,137 B2
(45) Date of Patent: Sep. 27, 2016

(54) PHOTO-CURABLE/THERMALLY CURABLE COMPOSITION, METHOD FOR MANUFACTURING CURED PRODUCT THEREOF, CURED PRODUCT, AND PRINTED WIRING BOARD INCLUDING THE SAME

(71) Applicant: TAIYO HOLDINGS CO., LTD., Nerima-ku (JP)

(72) Inventors: Sungho Choi, Bucheon-si (KR); Masayuki Shimura, Hiki-gun (JP); Takeshi Yoda, Higashimatsuyama-shi (JP); Shigeru Ushiki, Hiki-gun (JP)

(73) Assignee: Taiyo Holdings Co., Ltd., Nerima-ku (JP)

( * ) Notice: Subject to any disclaimer, the term of this patent is extended or adjusted under 35 U.S.C. 154(b) by 0 days.

(21) Appl. No.: 14/389,579

(22) PCT Filed: Mar. 25, 2013

(86) PCT No.: PCT/JP2013/058635
§ 371 (c)(1),
(2) Date: Sep. 30, 2014

(87) PCT Pub. No.: WO2013/146706
PCT Pub. Date: Oct. 3, 2013

(65) Prior Publication Data
US 2015/0064417 A1   Mar. 5, 2015

(30) Foreign Application Priority Data

Mar. 30, 2012 (JP) ................................. 2012-081985

(51) Int. Cl.
| | | |
|---|---|---|
| C09D 11/30 | (2014.01) | |
| C08G 18/62 | (2006.01) | |
| G03C 1/498 | (2006.01) | |
| B41M 7/00 | (2006.01) | |
| C08F 2/48 | (2006.01) | |
| H05K 3/28 | (2006.01) | |
| C08F 222/10 | (2006.01) | |
| C09D 11/101 | (2014.01) | |
| C09D 11/322 | (2014.01) | |
| B41J 2/00 | (2006.01) | |
| C09D 11/107 | (2014.01) | |

(52) U.S. Cl.
CPC .................. *C09D 11/30* (2013.01); *B41J 2/00* (2013.01); *B41M 7/009* (2013.01); *C08F 2/48* (2013.01); *C08F 222/1006* (2013.01); *C08G 18/62* (2013.01); *C09D 11/101* (2013.01); *C09D 11/107* (2013.01); *C09D 11/322* (2013.01); *G03C 1/498* (2013.01); *H05K 3/287* (2013.01); *H05K 2203/013* (2013.01); *Y10T 428/24802* (2015.01); *Y10T 428/24917* (2015.01)

(58) Field of Classification Search
CPC .. B41M 5/50; H05K 1/00; Y10T 428/24917; C08F 2/48; C08G 18/62; C09D 11/101; G03C 1/498
USPC ........................ 522/168, 173, 178, 183, 184; 430/270.1, 280.1, 281.1, 350; 428/32.1, 901
See application file for complete search history.

(56) References Cited

U.S. PATENT DOCUMENTS

| | | |
|---|---|---|
| 5,153,101 A | 10/1992 | Meier et al. |
| 5,286,611 A | 2/1994 | Meier et al. |
| 5,506,321 A | 4/1996 | Koto et al. |
| 5,770,347 A | 6/1998 | Saitoh et al. |
| 2003/0008156 A1* | 1/2003 | Pocius et al. ................. 428/457 |
| 2006/0058412 A1* | 3/2006 | Kakinuma et al. ........... 522/168 |
| 2008/0018725 A1* | 1/2008 | Mogi et al. ................... 347/102 |
| 2012/0029107 A1 | 2/2012 | Berens et al. |
| 2015/0064417 A1* | 3/2015 | Choi et al. ................. 428/195.1 |

FOREIGN PATENT DOCUMENTS

| | | |
|---|---|---|
| CN | 1784432 A | 6/2006 |
| JP | 56-66089 | 6/1981 |
| JP | 56-157089 | 12/1981 |
| JP | 58-50794 | 3/1983 |
| JP | 03-050549 | 3/1991 |
| JP | 06-237063 | 8/1994 |
| JP | 07-261385 | 10/1995 |
| JP | 07-263845 | 10/1995 |
| JP | 08-234432 | 9/1996 |
| JP | 08-236902 | 9/1996 |
| JP | 09-018115 | 1/1997 |
| JP | 2003-268271 A | 9/2003 |
| JP | 2008-239937 | 10/2008 |
| JP | 06-295060 | 10/2010 |
| WO | 2010/108862 | 9/2010 |

OTHER PUBLICATIONS

International Search Report Issued Jun. 18, 2013 in PCT/JP13/058635 Filed Mar. 25, 2013.
Office Action issued Aug. 2, 2016, in Japanese Patent Application No. 2014-507876.
Office Action issued Jul. 25, 2016 in Chinese Patent Application No. 201380016111.5.

* cited by examiner

*Primary Examiner* — Betelhem Shewareged
(74) *Attorney, Agent, or Firm* — Oblon, McClelland, Maier & Neustadt, L.L.P.

(57) ABSTRACT

A photocurable and thermally curable composition having a viscosity suitable for application to an inkjet printer is prepared. By the composition, it is made possible to directly draw a pattern on a substrate for a printed wiring board. The composition is cured at a relatively low temperature, having excellent adhesion, chemical resistance, heat resistance, and insulating properties after curing. The photocurable and thermally curable composition includes a (meth)acryloyl group-containing monomer, a block isocyanate, and a photopolymerization initiator, wherein the composition is applicable to inkjet printing.

21 Claims, 1 Drawing Sheet

FIG. 1

FIG. 2

PHOTO-CURABLE/THERMALLY CURABLE COMPOSITION, METHOD FOR MANUFACTURING CURED PRODUCT THEREOF, CURED PRODUCT, AND PRINTED WIRING BOARD INCLUDING THE SAME

TECHNICAL FIELD

The present invention relates to a photocurable and thermally curable composition, in particular, a photocurable and thermally curable composition that is applicable to inkjet printing.

Furthermore, the present invention relates to a method for manufacturing a cured product obtained by using the photocurable and thermally curable composition, a cured product, and a printed wiring board having the cured product.

BACKGROUND ART

Conventionally, a photographic development method and a screen printing method have been used for forming an etching resist, a solder resist, and marking for a printed wiring board.

In the photographic development method, patterning is performed by applying a photosensitive resin material and a photomask on a substrate, exposing the photosensitive resin to light to photo-cure only in parts without being covered with the photomask, and dissolving an uncured photosensitive resin material in a developer. A solder resist and marking materials are further cured by heating or the like. As to an etching resist, a copper foil in a region not covered with the etching resist is removed by etching, for obtaining wiring pattern. On the other hand, in the screen printing method, pattern formation is performed by using a stencil to allow an ink to be transferred by a squeegee, wherein it is difficult to obtain a highly fine pattern.

In order to simplify wiring patterning, an inkjet method has been used in recent years (Patent Literatures 1 to 4). This method is a method including drawing a conductor circuit pattern on a metal foil provided on a plastic substrate by using an inkjet printer. By the method, an etching resist is prepared, with which an etching treatment is carried out. In the inkjet method, CAD data can be sent to the printer in advance. Therefore, accurate printing can be performed with respect to the metal foil, and also positioning is easily made. In addition, when the inkjet method is used, a wiring pattern can be directly drawn on the metal foil. Accordingly, it is possible to significantly reduce labor and time required for a step of manufacturing a printed wiring board, compared with those for the photographic development method and the screen printing method, and consumables such as a developer, a resist ink, and a cleaning solvent can be reduced, as advantages of inkjet printing.

Furthermore, it is proposed to use an inkjet printer for printing a solder resist, which is for protecting a conductor circuit formed on a printed wiring board (Patent Literatures 5 and 6). The formation/printing method is the same as the wiring patterning except that a subject to be printed is the printed wiring board on which the conductor circuit has already been formed. The solder resist is printed on a portion of the printed wiring board, where soldering for mounting parts is not performed. Also in this case, the use of inkjet printer helps to use the number of treatment steps, time, and consumables to be used, compared with the use of photographic development method or the screen printing method.

In addition to the above, proposals are made to use a system in which a plurality of steps are performed by a single ink jet printer provided with ink tanks, separately for an etching resist ink, a solder resist ink, a marking ink, and corresponding curing agents for these (Patent Literature 7).

PRIOR ART LITERATURE

Patent Literature

Patent Literature 1: JP-A 56-66089
Patent Literature 2: JP-A 56-157089
Patent Literature 3: JP-A 58-50794
Patent Literature 4: JP-A 6-237063
Patent Literature 5: JP-A 7-263845
Patent Literature 6: JP-A 9-18115
Patent Literature 7: JP-A 8-236902

SUMMARY OF INVENTION

Problems to be Solved by the Invention

However, it has not been a particular proposal of an ink composition specialized for use in the inkjet method, in any of the wiring patterning of a printed wiring board described in Patent Literatures 1 to 4, the printing of a solder resist for protecting a conductor circuit formed on a printed wiring board described in Patent Literatures 5 and 6, and the method for performing a plurality of steps in printed wiring board formation by a single inkjet printer described in Patent Literature 7. The inks described in Patent Literatures 1 to 7 are obtained by heavily diluting an ink having a high viscosity with a solvent, and thus have a low solid content. Therefore, it is difficult, in reality, to use such inks in the inkjet method.

With respect to the viscosity of an ink, for example, an ink having a high viscosity of about 20,000 mPa·s, such as an ink for screen printing, is difficult to be made into an ink having a viscosity suitable for an inkjet printer only by dilution.

Furthermore, when a composition for a resist, which includes a large amount of solvent for dilution, is used to form a resist on a substrate, the solvent is volatilized by heating and curing to decrease a non-volatile content as an absolute amount of the composition after volatilization. Thus, it is difficult to obtain a resist layer having a desired film thickness.

In this way, substantially no resin composition such as that for a resist ink has been prepared, which can be used in an inkjet printer and is for resin insulating layer formation.

Accordingly, an object of the present invention is to provide a photocurable and thermally curable composition having a viscosity suitable for application to an inkjet printer, and cured at a relatively low temperature, which makes it possible to directly draw a pattern on a substrate for a printed wiring board, having an excellent adhesion, chemical resistance, heat resistance, and insulating properties as a cured product.

Means for Solving the Problems

In order to solve the above problems, the photocurable and thermally curable composition of the present invention comprises a (meth)acryloyl group-containing monomer, a block isocyanate, and a photo-polymerization initiator, and the composition is used for in inkjet printing.

The photocurable and thermally curable composition of the present invention is applicable as an ink of an inkjet printer, by which a pattern can be directly printed on a substrate for a printed wiring board. Furthermore, the photocurable and thermally curable composition of the present invention is cured by light irradiation and heating, and thus is formed into a cured product having excellent adhesion, chemical resistance, heat resistance, and insulating properties.

In a method for manufacturing a cured product of the photocurable and thermally curable composition of the present invention, the cured product is manufactured by applying the photocurable and thermally curable composition to the substrate using an inkjet printer to form a composition layer, irradiating the composition layer with light to photo-cure the composition layer, and thermally curing the photo-cured composition layer by heating.

Accordingly, the composition of the present invention can be simply cured on the substrate, and at the same time, the composition after curing has excellent physical properties such as adhesion, chemical resistance, heat resistance, and insulating properties.

Accordingly, a printed wiring board having the cured product of the present invention exhibits excellent physical properties in manufacturing and use thereof, and is excellent in manufacturing efficiency and durability.

Effects of Invention

In the composition of the present invention, (meth)acryloyl group-containing monomer can be polymerized in the presence of an isocyanate at a relatively low temperature for a short time, and thus can provide a cured product or a coating film including a poly(meth)acrylate as a main component, which is excellent in physical properties such as adhesion, hardness, chemical resistance, heat resistance, and insulating properties.

The photocurable and thermally curable composition of the present invention has a low viscosity, which is applicable as an ink of an inkjet printer for directly printing a pattern on a substrate for a printed wiring board. Furthermore, the photocurable and thermally curable composition has excellent stability for one-component storage In addition, the photocurable and thermally curable composition of the present invention can be cured by heating at a low temperature, i.e., at 170° C. or less, and thus can minimize the influence by heat applied to a substrate to be used.

Therefore, the printed wiring substrate of the present invention can be efficiently manufactured, having the above-mentioned physical properties, and excellent durability even for long-term use.

MODE FOR CARRYING OUT THE INVENTION

The photocurable and thermally curable composition of the present invention comprises a (meth)acryloyl group-containing monomer, a block isocyanate, and a photopolymerization initiator.

In the present invention, the (meth)acryloyl group-containing monomer preferably has no functional group that can react with isocyanate.

In this case, a composition including the (meth)acryloyl group-containing monomer (also referred to as (meth)acrylate) and isocyanate is heated at a predetermined temperature for a predetermined time to obtain homopolymerization of the (meth)acryloyl group-containing monomer, producing poly(meth)acrylate.

While homopolymerization of (meth)acrylate usually occurs by heating at 200° C. or more, the photocurable and thermally curable composition of the present invention is heated at 140° C. to 170° C., preferably 150° C. to 170° C. for 5 minutes to 60 minutes, to polymerize (meth)acrylate included in the composition.

It is considered that the reaction of forming poly(meth)acrylate in the present invention occurs as a result of the followings: Namely, when heat is applied to the formulation under the coexistence of isocyanate and (meth)acrylate. The presence of (meth)acryloyl promotes isocyanate trimerization reaction. The activity of (meth)acryloyl group is improved by the isocyanate trimerization reaction.

In the present invention, the (meth)acryloyl group-containing monomer does not have to have a functional group that can react with isocyanate. In general, isocyanate reacts with a compound containing a an active hydrogen atom, which is active against isocyanate, such as OH or $NH_2$, but does not react with a (meth)acryloyl group of (meth)acrylate. Therefore, when (meth)acrylate is allowed to react with isocyanate, (meth)acrylate such as (meth)acrylate having an active hydrogen atom is used. In order to obtain a cured product having a network crosslinking structure, for the purpose of achieving chemical resistance and heat resistance in the reaction of isocyanate, it is preferable to use a monomer having two or more active hydrogen atoms in the molecule. In the present invention, however, an active hydrogen atom does not have to be included in the molecule, since the intended properties can be attained by the formation of polyacrylate.

Herein, in order to precede the polymerization of (meth)acrylate, the photocurable and thermally curable composition of the present invention preferably has no compound having a functional group that can react with isocyanate, at all even as other additional components.

In addition, heat locally generated by the trimerization reaction of isocyanate is also considered to aid the polymerization of (meth)acrylate to proceed.

Since a coating film resulting from a reaction product obtained by a reaction mechanism of the present invention has comprehensively excellent physical properties such as high adhesion, chemical resistance, and heat resistance, the film is extremely effectively used in various applications.

The trimerization of isocyanate forms isocyanurate having a triazine ring structure. A coating film or a cured product formed from a compound including a triazine ring structure is excellent in heat resistance and insulating properties, and thus useful as a heat-resistant material or an insulating material.

Even when isocyanate having a functionality of 3 or more is used, a network structure having a triazine skeleton is formed. A material having such a network structure has an effect of enhancing heat resistance and chemical resistance of a coating film or cured product comprising the material.

According to the method of the present invention, a reaction mixture which includes poly(meth)acrylate and an oligomer such as a trimer of isocyanate is produced, and the reaction mixture is cured to form a coating film excellent in adhesion, hardness, chemical resistance, heat resistance, and insulating properties.

[(Meth)Acryloyl Group-Containing Monomer]

In the present invention, the (meth)acryloyl group-containing monomer has one or more (meth)acryloyl groups in a molecule. In addition, a compound having no functional group that can react with isocyanate can be used as the (meth)acryloyl group-containing monomer.

Herein, the functional group that can react with isocyanate is a functional group including an active hydrogen atom, such as OH group, NH group, $NH_2$ group, SH group, and COOH group.

Examples of (meth)acrylate for use in the present invention include monofunctional (meth)acrylates such as 2-(2-ethoxyethoxy)ethyl(meth)acrylate, butyl(meth)acrylate, stearyl(meth)acrylate, tridecyl(meth)acrylate, lauryl(meth)acrylate, isobornyl(meth)acrylate, 2-hydroxyethyl(meth)acrylate, 2-hydroxypropyl(meth)acrylate, and 2-phenoxyethyl(meth)acrylate; and a polyfunctional (meth)acrylate compound including difunctional (meth)acrylates such as 1,3-butylene glycol di(meth)acrylate, 1,4-butanediol di(meth)acrylate, 1,6-hexanediol di(meth)acrylate, diethylene glycol di(meth)acrylate, polyethylene glycol di(meth)acrylate, polypropylene glycol di(meth)acrylate, tricyclodecane dimethanol di(meth)acrylate, and neopentyl glycol diacrylate, trifunctional (meth)acrylates such as trimethylolpropane triacrylate, and tetra- or higher functional (meth)acrylates such as pentaerythritol tetraacrylate, ditrimethylolpropane tetraacrylate, dipentaerythritol pentaacrylate, and dipentaerythritol hexaacrylate.

Additionally, a functional group having an active hydrogen atom, for example, a (meth)acrylate having an OH group, an NH group, an $NH_2$ group, an SH group, and a COOH group can be used in combination in the present invention.

For example, acrylates of at least one of ethylene oxide adducts and propylene oxide adducts of monofunctional alcohols such as pentaerythritol triacrylate and hydroxybutyl acrylate, and polyfunctional alcohols such as trimethylolpropane and hydrogenated bisphenol A or polyhydric phenols such as bisphenol A and biphenol; polyfunctional or monofunctional polyurethane acrylates such as isocyanate-modified products of hydroxyl group-containing acrylates; epoxy acrylates such as (meth)acrylic acid adducts of bisphenol A diglycidyl ether, hydrogenated bisphenol A diglycidyl ether, and a phenol novolac epoxy resin, and corresponding methacrylate compounds can be used. Acrylic acid can also be used.

Examples of the product name of a commercially available (meth)acrylate compound include Neomer DA-600 (produced by Sanyo Chemical Industries, Ltd.), Aronix M-309, M-7100, and M-309 (produced by Toagosei Co., Ltd.), A-DCP (produced by Shin-Nakamura Chemical Co., Ltd.), 1.6HX-A (produced by Kyoei Kagaku Kogyo), FA-125 (produced by Hitachi Chemical Co., Ltd.), EPTRA and HDDA (produced by Daicel-Cytec Co., Ltd.), and 4HB (produced by Osaka Organic Chemical Industry Ltd.).

The (meth)acryloyl group-containing monomer may be used singly or in combinations of two or more.

In the present invention, a polyfunctional (meth)acryloyl group-containing monomer, in particular, a tri- or higher functional (meth)acryloyl group-containing monomer is preferably used. By using the monomer, a cured product (cured coating film), which is obtained by printing the photocurable and thermally curable composition of the present invention on a substrate such as a substrate and curing, has extremely good heat resistance, hardness, and chemical resistance.

Furthermore, in the present invention, the (meth)acryloyl group-containing monomer preferably includes at least one of the aforementioned polyfunctional (meth)acryloyl group-containing monomers (polyfunctional (meth)acrylates) and the monofunctional (meth)acryloyl group-containing monomers (monofunctional (meth)acrylates).

Also in this case, the polyfunctional (meth)acryloyl group-containing monomer, in particular, a tri- or high functional (meth)acryloyl group-containing monomer is preferably used. As mentioned previously, the polyfunctional (meth)acryloyl group-containing monomer imparts extremely good photo-curing properties to the photocurable and thermally curable composition, and excellent heat resistance, hardness, and chemical resistance to the cured coating film.

On the other hand, the monofunctional (meth)acryloyl group-containing monomer has an effect of diluting the composition, as being applicable to ink jet printing, and increasing toughness and flexibility of the cured coating film. The amount of the monofunctional (meth)acryloyl group-containing monomer used is determined, depending on properties and viscosity of a cured product to be obtained. The monofunctional (meth)acryloyl group-containing monomer is used in an amount of 10 to 400 parts by weight, preferably 20 to 300 parts by weight, and further preferably 30 to 200 parts by weight, based on 100 parts by weight of the polyfunctional (meth)acryloyl group-containing monomer.

If the amount of the monofunctional (meth)acryloyl group-containing monomer used is less than 10 parts by weight based on 100 parts by weight of the polyfunctional (meth)acryloyl group-containing monomer, the composition has a high viscosity, and inkjet printing, in particular, a jet of ink may be difficult, causing clogging of a printer, and the like.

On the other hand, if the amount of a functional (meth)acryloyl group-containing monomer used is more than 400 parts by weight based on 100 parts by weight of the polyfunctional (meth)acryloyl group-containing monomer, the composition is poor in heat resistance and chemical resistance.

[Block Isocyanate]

In the present invention, as an isocyanate compound, a block isocyanate blocked by a known blocking agent (sealing agent) is used. As the block isocyanate, aliphatic/alicyclic isocyanate and aromatic isocyanate having a block can be used.

The block isocyanate for use in the present invention has a protective group (block), and thus is effective in that the block isocyanate leaves the protective group only after being heated to a higher temperature state and serves as isocyanate to be in excellent in storage stability.

In the present invention, blocked polyfunctional isocyanate is preferably used. When the blocked polyfunctional isocyanate is used, it has a network structure bearing a triazine skeleton, and thus heat resistance, chemical resistance, and the like are enhanced.

The amount of the block isocyanate to be blended is 2 to 200 parts by weight and preferably 2 to 100 parts by weight, based on 100 parts by weight of the total of the polyfunctional (meth)acryloyl group-containing monomer and the monofunctional (meth)acryloyl group-containing monomer. If the amount is less than 2 parts by weight, sufficient thermosetting properties are not obtained, and adhesion, chemical resistance, and heat resistance not to be obtainable. If the amount exceeds 200 parts by weight, the content of an acryloyl monomer becomes small, and ultraviolet curing properties would be insufficient.

Specifically, isocyanate including aliphatic/alicyclic isocyanates and aromatic isocyanates (described later) blocked by a blocking agent (described later) can be used.
[Isocyanates]

As the aliphatic/alicyclic isocyanate compounds, for example, 1,6-hexamethylene diisocyanate (HDI or HMDI), isophorone diisocyanate (IPDI), methylcyclohexane 2,4-(2,6)-diisocyanate (hydrogenated TDI), 4,4'-methylenebis(cyclohexylisocyanate) (hydrogenated MDI), 1,3-(isocyanatomethyl)cyclohexane (hydrogenated XDI), norbornene diisocyanate (NDI), lysine diisocyanate (LDI), trimethylhexamethylene diisocyanate (TMDI), dimer acid diisocyanate (DDI), and N,N',N"-tris(6-isocyanate-hexamethylene) biuret can be used.

As the aromatic isocyanate compound, for example, tolylene diisocyanate (TDI), 4,4'-diphenylmethane diisocyanate (MDI), and xylylene diisocyanate (XDI) can be used.

In the present invention, any of these isocyanates may be used singly, or two or more thereof may be used.

Besides them, a trimer of 1,6-hexamethylene diisocyanate and a trimer of isophorone diisocyanate may also be used.
[Blocking agent] Examples of the blocking agent include alcohols such as ethanol, n-propanol, isopropanol, t-butanol, and isobutanol; phenols such as phenol, chlorophenol, cresol, xylenol, and p-nitrophenol; alkylphenols such as p-t-butylphenol, p-sec-butylphenol, p-sec-amylphenol, p-octylphenol, and p-nonylphenol; basic nitrogen-containing compounds such as 3-hydroxypyridine, 8-hydroxyquinoline, and 8-hydroxyquinaldine; active methylene compounds such as diethyl malonate, ethyl acetoacetate, and acetylacetone; acid amides such as acetamide, acrylamide, and acetanilide, acid imides such as succinimide and maleic imide; imidazoles such as 2-ethylimidazole and 2-ethyl-4-methylimidazole; pyrazoles such as pyrazole, 3-methylpyrazole, and 3,5-dimethylpyrazole; lactams such as 2-pyrrolidone and 8-caprolactam; oximes of ketone or aldehyde, such as acetoxime, methyl ethyl ketone oxime, cyclohexanone oxime, and acetaldoxime; ethyleneimine; and bisulfite.

As the block isocyanate, a blocked isocyanate blocked by at least any one of an active methylene compound and pyrazoles is preferable, a blocked isocyanate blocked by at least any one of diethyl malonate and 3,5-dimethylpyrazole is more preferable, and a blocked isocyanate blocked by 3,5-dimethylpyrazole is particularly preferable.

The blocking agent may be used singly or in combinations of two or more, or a plurality of block isocyanates each blocked by a blocking agent or two or more blocking agents may be used. Examples of a product name of a commercially available block isocyanate include BI7982 and BI7992 (both produced by Baxenden Chemicals Ltd.).

The photocurable and thermally curable composition for use in the present invention further includes the following photo-polymerization initiator.
[Photo-Polymerization Initiator]

The photo-polymerization initiator to be used is not particularly limited as long as the initiator allows (meth) acrylate to polymerize by irradiation of an energy beam thereto. A radical polymerization initiator can be used therefor.

As a photo-radical polymerization initiator, any photo-radical polymerization initiator can be used, which generates a radical by light, laser, an electron beam, or the like to start a radical polymerization reaction. Examples of the photo-radical polymerization initiator include benzoin and benzoin alkyl ethers such as benzoin, benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, and 1,1-dichloroacetophenone; aminoacetophenones such as 2-methyl-1-[4-(methylthio)phenyl]-2-morpholinopropan-1-one, 2-benzyl-2-dimethylamino-1-(4-morpholinophenyl)-butan-1-one, and N,N-dimethylaminoacetophenone; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; a 2,4,5-triaryl imidazole dimer; riboflavine tetrabutyrate; thiol compounds such as 2-mercaptobenzimidazole, 2-mercaptobenzoxazole, and 2-mercaptobenzothiazole; organohalogen compounds such as 2,4,6-tris-s-triazine, 2,2,2-tribromoethanol, and tribromomethylphenyl sulfone; benzophenones such as benzophenone and 4,4'-bisdiethylaminobenzophenone, or xanthones; and 2,4,6-trimethylbenzoyl diphenylphosphine oxide.

The photo-radical polymerization initiators can be used singly or as a mixture of these thereof. In addition thereto, a photoinitiator aid, for example, tertiary amines such as N,N-dimethylamino benzoic acid ethyl ester, N,N-dimethylamino benzoic acid isoamyl ester, pentyl-4-dimethylamino benzoate, triethylamine, and triethanolamine can be used. A titanocene compound such as CGI-784 (produced by BASF Japan Ltd.) having absorption in a visible light region, or the like can also be added to the photo-radical polymerization initiator in order to promote a photoreaction. Herein, a component to be added to the photo-radical polymerization initiator is not limited to the above, and any components can be used, which absorb light of ultraviolet and visible light regions to allow radical polymerization of monomers having an unsaturated group such as a (meth) acryloyl group. Not only the photo-polymerization initiator and the photoinitiator aid, but also the a component can be used singly or in combinations of two or more.

The amount of the photo-polymerization initiator to be blended is 0.5 to 15 parts by weight, more preferably 0.5 to 10 parts by weight, and further preferably 1 to 10 parts by weight based on 100 parts by weight of the (meth)acryloyl group-containing monomer.

Examples of a product name of a commercially available photo-polymerization initiator include Irgacure 907 and Irgacure 127 (both produced by BASF Japan Ltd.).
[Other Additives]

The photocurable and thermally curable resin composition of the present invention can contain additives such as an antifoam-leveling agent, a thixotropy imparting agent/thickener, a coupling agent, a dispersant, and a flame retardant, if necessary.

As the antifoamer-leveling agent, compounds such as silicone, modified silicone, a mineral oil, a vegetable oil, an aliphatic alcohol, a fatty acid, a metal soap, a fatty acid amide, a polyoxyalkylene glycol, a polyoxyalkylene alkyl ether, and a polyoxyalkylene fatty acid ester can be used.

As the thixotropy imparting agent/thickener, clay minerals such as kaolinite, smectite, montmorillonite, bentonite, talc, mica, and zeolite, fine particle silica, silica gel, an amorphous inorganic particle, a polyamide-based additive, a modified urea-based additive, and a wax type additive can be used.

The antifoam-leveling agent, and the thixotropy imparting agent/thickener can be added to adjust surface properties of the cured product, and characteristics of the composition.

As the coupling agent, silane coupling agents having an alkoxy group such as a methoxy group, an ethoxy group, or acetyl, and a reactive functional group such as vinyl, methacryl, acryl, epoxy, cyclic epoxy, mercapto, amino, diamino, acid anhydride, ureido, sulfide, isocyanate, for example, vinyl type silane compounds such as vinylethoxysilane, vinyltrimethoxysilane, vinyltris(β-methoxyethoxy)silane, and γ-methacryloxypropyltrimethoxysilane, amino type silane compounds such as γ-aminopropyltrimethoxysilane, N-β-(aminoethyl)γ-aminopropyltrimethoxysilane, N-β-(aminoethyl)γ-aminopropylmethyldimethoxysilane, and γ-ureidopropyltriethoxysilane, epoxy type silane compounds such as γ-glycidoxypropyltrimethoxysilane, β-(3,4-epoxycyclohexyl)ethyltrimethoxysilane, and γ-glycidoxypropylmethyldiethoxysilane, mercapto type silane compounds such as γ-mercaptopropyltrimethoxysilane, and phenylamino type silane compounds such as N-phenyl-γ-aminopropyltrimethoxysilane, titanate type coupling agents such as isopropyl triisostearoyl titanate, tetraoctyl bis(ditridecylphosphite) titanate, bis(dioctylpyrophosphate)oxyacetate titanate, isopropyl tridodecylbenzenesulfonyl titanate, isopropyl tris(dioctylpyrophosphate) titanate, tetraisopropyl bis(dioctylphosphite) titanate, tetra(1,1-diallyloxymethyl-1-butyl)bis-(ditridecyl)phosphite titanate, bis(dioctylpyrophosphate)ethylene titanate, isopropyltrioctanoyl titanate, isopropyl dimethacryl isostearoyl titanate, isopropyl tristearoyl diacryl titanate, isopropyl tri(dioctylphosphate) titanate, isopropyl tricumyl phenyl titanate, dicumyl phenyloxy acetate titanate, and diisostearoyl ethylene titanate; zirconate type coupling agents such as an ethylenically unsaturated zirconate-containing compound, a neoalkoxy zirconate-containing compound, neoalkoxytrisneodecanoyl zirconate, neoalkoxytris(dodecyl)benzenesulfonyl zirconate, neoalkoxytris(dioctyl)phosphate zirconate, neoalkoxytris(dioctyl)pyrophosphate zirconate, neoalkoxytris(ethylenediamino)ethyl zirconate, neoalkoxytris(m-amino)phenyl zirconate, tetra(2,2-diallyloxymethyl)butyl di(ditridecyl)phosphito zirconate, neopentyl(diallyl)oxy trineodecanoyl zirconate, neopentyl(diallyl) oxy tri(dodecyl)benzene-sulfonyl zirconate, neopentyl (diallyl)oxy tri(dioctyl)phosphato zirconate, neopentyl (diallyl)oxy tri(dioctyl)pyro-phosphato zirconate, neopentyl (diallyl)oxy tri(N-ethylenediamino)ethyl zirconate, neopentyl(diallyl)oxy tri(m-amino)phenyl zirconate, neopentyl(diallyl)oxy trimethacryl zirconate, neopentyl(diallyl) oxy triacryl zirconate, dineopentyl(diallyl)oxy dip araaminobenzoyl zirconate, dineopentyl(diallyl)oxy di(3-mercapto) propionic zirconate, and zirconium (IV) 2,2-bis(2-propenolatomethyl)butanolato, cyclodi[2,2-(bis2-propenolatomethyl)butanolato]pyrophosphato-O,O zirconate; aluminate type coupling agents such as diisobutyl (oleyl)acetoacetyl aluminate and alkyl acetoacetate aluminum diisopropylate; and the like can be used.

As the dispersant, high-molecular-weight type dispersants such as polycarboxylic acid type, naphthalene sulfonic acid formalin condensation type, polyethylene glycol, polycarboxylic acid partial alkyl ester type, polyether type, and polyalkylene polyamine type dispersants; low molecular-weight type dispersants such as alkyl sulfonic acid type, quaternary ammonium type, higher alcohol alkylene oxide type, polyhydric alcohol ester type, and alkylpolyamine type dispersants; and the like can be used. As the flame retardant, hydrated metal type flame retardants such as aluminum hydroxide and magnesium hydroxide, red phosphorus, ammonium phosphate, ammonium carbonate, zinc borate, zinc stannate, a molybdenum compound type flame retardant, a bromine compound type flame retardant, a chlorine compound type flame retardant, phosphoric acid ester, phosphorus-containing polyol, phosphorus-containing amine, melamine cyanurate, a melamine compound, a triazine compound, a guanidine compound, a silicone polymer, and the like can be used.

In order to adjust the polymerization speed and the degree of polymerization, a polymerization inhibitor and a polymerization retardant can also be added.

A solvent may also be used for adjusting the viscosity of the photocurable and thermally curable resin composition of the present invention. The amount of the solvent is preferably small in order to prevent the film from reducing the thickness after being cured. It is more preferable not to include the solvent for such viscosity adjustment.

A coloring pigment, a dye, or the like may be added to the photocurable and thermally curable resin composition of the present invention for the purpose of coloring. As the coloring pigment, the dye, or the like can be used from the commonly used known materials, which are represented by color indexes. Examples include Pigment Blue 15, 15:1, 15:2, 15:3, 15:4, 15:6, 16, 60, Solvent Blue 35, 63, 68, 70, 83, 87, 94, 97, 122, 136, 67, 70, Pigment Green 7, 36, 3, 5, 20, 28, Solvent Yellow 163, Pigment Yellow 24, 108, 193, 147, 199, 202, 110, 109, 139 179 185 93, 94, 95, 128, 155, 166, 180, 120, 151, 154, 156, 175, 181, 1, 2, 3, 4, 5, 6, 9, 10, 12, 61, 62, 62:1, 65, 73, 74, 75, 97, 100, 104, 105, 111, 116, 167, 168, 169, 182, 183, 12, 13, 14, 16, 17, 55, 63, 81, 83, 87, 126, 127, 152, 170, 172, 174, 176, 188, 198, Pigment Orange 1, 5, 13, 14, 16, 17, 24, 34, 36, 38, 40, 43, 46, 49, 51, 61, 63, 64, 71, 73, Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269, 37, 38, 41, 48:1, 48:2, 48:3, 48:4, 49:1, 49:2, 50:1, 52:1, 52:2, 53:1, 53:2, 57:1, 58:4, 63:1, 63:2, 64:1, 68, 171, 175, 176, 185, 208, 123, 149, 166, 178, 179, 190, 194, 224, 254, 255, 264, 270, 272, 220, 144, 166, 214, 220, 221, 242, 168, 177, 216, 122, 202, 206, 207, 209, Solvent Red 135, 179, 149, 150, 52, 207, Pigment Violet 19, 23, 29, 32, 36, 38, 42, Solvent Violet 13, 36, Pigment Brown 23, 25, and Pigment Black 1, 7. Such coloring pigment/dye or the like is preferably added in an amount of 0.01 to 5 parts by weight based on 100 parts by weight of the photocurable and thermally curable composition. When the photocurable and thermally curable composition of the present invention is used for marking, rutile type or anatase type titanium oxide is preferably added for insured visibility. In this case, rutile type or anatase type titanium oxide is preferably used in an amount of 1 to 20 parts by weight, based on 100 parts by weight of the photocurable and thermally curable composition. Such coloring pigment/dye or the like can be used singly or in combinations of two or more.

The photocurable and thermally curable composition of the present invention can be applied to inkjet printing. For the application to inkjet printing, the photocurable and thermally curable composition preferably has a viscosity ejectable from an inkjet printer.

The viscosity refers to the viscosity measured according to JIS K2283. The viscosity of the photocurable and thermally curable composition for inkjet has a viscosity at ordinary/room temperature (25° C.) of 150 m or less. As described above, the viscosity of an ink for use in an inkjet printer is required to be about 20 mPa·s or less at a temperature in coating. The above condition, however, can be satisfied by applying heat to the composition, before or during the coating, if the viscosity of the composition at the room temperature is 150 mPa·s or less.

Accordingly, the photocurable and thermally curable composition of the present invention makes it possible to directly print a pattern on a substrate for a printed wiring board or the like.

Furthermore, the photocurable and thermally curable composition of the present invention does not bring about a polymerization reaction at room temperature, and thus can be stably stored as one-pack formulation.

The photocurable and thermally curable composition of the present invention is applied as an ink in an inkjet printer, and used for printing on a substrate. The composition of the present invention has a very low ink viscosity. Therefore, the pattern or characters on the substrate, printed or coated with the composition are wet and spreads out or bleeds after a lapse of a long time, when inkjet method is used for the printing or coating.

The photocurable and thermally curable composition of the present invention includes a photo-polymerization initiator, and thus the composition layer thereof immediately after printing can be irradiated with light at 50 mJ/cm$^2$ to 1000 mJ/cm$^2$ to be thereby photo-cured. The irradiation with light is performed by irradiation with an active energy beam such as an ultraviolet ray, an electron beam, and a chemical ray, and preferably performed by irradiation of an ultraviolet ray.

For example, a composition including an ultraviolet photosensitive photo-polymerization initiator is irradiated with an ultraviolet ray for optically curing the composition layer.

Irradiation with an ultraviolet ray in an inkjet printer can be performed, for example, by mounting a light source such as a high pressure mercury lamp, a metal halide lamp, or an ultraviolet LED on the side surface of a print head, and moving the print head or the substrate to perform scanning. In this case, printing and irradiation with an ultraviolet ray can be performed almost at the same time.

The photocurable and thermally curable composition after photo-curing can be thermally cured by using a known heating means, for example, a heating furnace such as a hot air furnace, an electric furnace, or an infrared induction heating furnace.

Homopolymerization of (meth)acrylate generally occurs by heating the monomer at a temperature of 200° C. or more. On the other hand, the polymerization is carried out in the present invention by heating the photocurable and thermally curable composition at a temperature in the range of 140° C. to 170° C., preferably in the range of 150° C. to 170° C. Namely, thermal curing is carried out in the above-mentioned temperature range. As a result, complete curing is performed by the polymerization of (meth)acrylate.

If the temperature is lower than 140° C., polymerization of (meth)acrylate would be insufficient. On the other hand, if the temperature is greater than 170° C., substrate to which the photocurable and thermally curable composition is applied may be adversely affected by the heat application.

By heating at a temperature in the range of 140° C. to 170° C., almost all double bonds of the acryloyl groups are converted, leading to crosslinking of the (meth)acryloyl group-containing monomer.

In order that the cured product obtained by the photocurable and thermally curable composition of the present invention satisfies requirements for properties, the photocurable and thermally curable composition is preferably cured by heating at a temperature in the range of 150° C. to 170° C. for 5 minutes to 60 minutes.

As discussed above, the photocurable and thermally curable composition is pattern-wise printed on the substrate, and then cured through two stages of photo-curing, i.e., by photo-/optical curing by irradiation of light and then thermal curing by heating, thereby improving operating efficiency and general properties of the cured product.

The photocurable and thermally curable composition is suitable for inkjet printing, and is suitably used for, in particular, marking a printed wiring board by the inkjet method. Therefore, the composition of the present invention can be simply cured on the substrate, and at the same time the composition after curing has physical properties such as excellent adhesion, chemical resistance, heat resistance, and insulating properties.

Accordingly, a printed wiring board having the cured product of the present invention exhibits the above excellent physical properties in the course of manufacture and use, and is excellent in manufacture efficiency and durability.

When applied in an inkjet printer, the photocurable and thermally curable composition is preferable that the composition is not in the form of two-pack formulation in which the curing agent is added afterwards, but in the form of form of one-pack formulation, for excellent usability. Furthermore, a print head is often warmed to have a temperature, for example, 30° C. to 70° C., and hence the ink is also warmed for a long time. Therefore, when applied to an inkjet method, the composition in the form of a one-pack formulation having an excellent storage stability is preferably used as the ink therefor.

The photocurable and thermally curable composition of the present invention can be applied in various use, without particular limitation to the application object, since the composition is excellent in transparency, plasticity, impact resistance, adhesion, chemical resistance, heat resistance, insulating properties, and the like. For example, the composition is preferably used for a solder resist to be used for a printed wiring board, marking, or the like.

The present invention is not limited to have the structure in the configuration of the above-discussed embodiment and Examples, and can be variously modified within the scope of the invention.

EXAMPLES

Examples 1 to 8 and Comparative Examples 1 to 9

I. Preparation of Compositions

Components in Table 1 were blended in proportions shown therein, and stirred in a dissolver. In Examples 7 and 8, mixtures were further dispersed by a bead mill, and subjected to filtration by a disc filter of 1 μm. Thus, each of the composition of the present invention and Comparative compositions were obtained.

II. Property Test

The respective compositions were subjected to the following property tests. The results are shown in Table 1.
<1. Curing Properties Immediately after Coating>

An inkjet printer Dimatix Materials Printer DMP-2831 manufactured by Fujifilm Corporation was used. A spot UV irradiation machine was affixed to the printer by fixing the irradiation portion of the machine being secured to the side of a print head by use of an adhesive tape. Thus, an inkjet printer capable of UV irradiation simultaneously with coating was prepared.

This inkjet printer was charged with each of the composition of the present invention and Comparative compositions, and an L-shaped line having a width of 100 μm and a side length of 20 mm was printed on an aluminum plate (100 mm×200 mm×1 mm).

Almost at the same time with printing (after the elapse of about 0.5 seconds), the printed L-shaped line was irradiated with UV light by the spot UV irradiation machine. The amount of UV irradiation here was adjusted so that the accumulated amount of light was 300 mJ/cm$^2$.

The L-shaped line which had been preliminarily cured was observed by a loupe, and curing properties were evaluated by observation of the shape of line and finger touch of the line. The evaluation standard for the curing properties is as follows:

○: Line was accurately drawn without blurs nor wrinkles. No stickiness was observed by finger touch.

x: Line was accurately drawn without blurs nor wrinkles. However, slight stickiness was observed by finger touch.

<2. Adhesion>

A rectangular pattern of 10 mm×20 mm having a film thickness of 15 μm was printed on a copper-clad laminate for a printed wiring board (FR-4, 150 mm×95 mm×1.6 mm) with the composition, by using an inkjet printer Dimatix Materials Printer DMP-2831 manufactured by Fujifilm Corporation.

The laminate immediately after printing (after the elapse of about 0.5 seconds) was irradiated with UV using a high pressure mercury lamp in an accumulated amount of light of 300 mJ/cm$^2$. Subsequently, the laminate which had been irradiated with UV was heated in a hot air circulation type drying furnace at 150° C. for 30 minutes to cure the pattern by heating. Thus, a test sample was prepared.

Each one of longitudinal and lateral incisions was made in the rectangular pattern of each test sample by a cutter knife, and the sample was subjected to peeling by use of a cellophane tape. The evaluation standard for the peeling is as follows:

○: Almost no peeling was observed.

x: Peeling observed, which was transferred to Cellotape (Trademark).

<3. Chemical Resistance>

Test samples containing the above compositions were prepared in the same way as that described for the adhesion test. The states of the test samples were visually inspected (under non-treated state).

Each test sample was immersed in an aqueous 10% sulfuric acid solution at room temperature for 30 minutes, taken out, and washed with water and dried. Visual inspection was made with respect to each test sample, in such a state that a coating film had not been treated after being immersed in the aqueous sulfuric acid solution and dried (after chemical test), and also in the state after peeling test by Cellotape (Trademark) (after peeling). Evaluation was made based on the following standard:

○: No change observed not only in the coating film after chemical test but also in the coating film after peeling, compared with the coating film under non-treated state.

Δ: No change observed in the coating film after chemical test, but a slight peeling was observed in the coating film after peeling, different from the coating film under non-treated state.

x: Lifting/peeling of the coating film was observed after chemical test, or peeling with large degree of transfer to Cellotape (Trademark) was observed, different from the coating film under non-treated state.

<4. Heat Resistance>

Test samples containing the above compositions were prepared in the same way as that described for the adhesion test. The samples were coated with a rosin type flux (SF-270 produced by Sanwa Kagaku Corp.), and immersed in a solder tank at 260° C. for 10 seconds. Samples were taken out from a solder tank, allowed to air-drying, then washed with propylene glycol monomethyl ether acetate and dried. This test was repeated three times, then the state of the coating film of each test sample was visually inspected, and thereafter the coating film was subjected to peeling by Cellotape (Trademark). Evaluation was made based on the following standard:

○: No change observed for the state of the coating film.

Δ: No change observed in the coating film, but a slight peeling was observed in the coating film after peeling with Cellotape (Trademark).

x: Lifting/peeling of the coating film was observed after chemical test, or peeling with large degree of transfer Cellotape (Trademark) was observed.

<5. Insulating Properties>

A rectangular pattern of 10 mm×20 mm having a film thickness of 40 μm was printed with each of the above compositions, on an interdigitated array electrode B coupon (substrate) of the IPC B-25 test pattern.

To the above-prepared laminate immediately after printing (after about 0.5 seconds), UV ray was irradiated using a high pressure mercury lamp in an accumulated amount of light of 300 mJ/cm$^2$. Then, this laminate irradiated with UV was heated in a hot air circulation type drying furnace at 150° C. for 30 minutes. In this way, the samples were obtained by curing the samples with the application of heat thereto. A bias of DC 500 V was applied to the resulting test sample, and the insulation resistance value was measured. Evaluation was made based on the following standard:

○: insulation resistance value ≥100 GΩ x: insulation resistance value <100 GΩ

<6. Storage Stability 1>

The viscosities of the compositions were measured (initial viscosity).

Thereafter, the compositions were stored in a sealed container at 50° C. for 2 weeks and then the viscosities thereof were measured again to determine the increase of viscosities (%).

Herein, the increase of viscosity is defined as "viscosity after 2 weeks storage/initial viscosity×100%."

The viscosities were evaluated based on the following standard:

○: Viscosity increase of 10% or less.

Δ: 10% or more and less than 20% x: 20% or more, or unmeasurable because of solidification

<7. Storage Stability 2>

The viscosities of the compositions were measured (initial viscosity).

Thereafter, the compositions were stored in an uncovered container under an environment at a temperature of 25° C. and a humidity of 70% for 12 hours. Then, the viscosities of the compositions were measured again to determine the increase of viscosities (%).

Herein, the increase of viscosity is defined as "viscosity after 12 hours storage/initial viscosity×100%."

The increase of viscosities was evaluated based on the following standard:

○: Increase of viscosity was 1% or less.

Δ: 1% or more and less than 10% x: 10% or more

<8. Visibility Test>

A solder resist PSR-4000 G24 produced by Taiyo Ink Mfg. Co., Ltd. was used for providing a solid-printed by screen printing on a copper-clad laminate (FR-4, 150 mm×95 mm×1.6 mm), which is for a printed wiring board. The screen printing was performed so that a coating film have a thickness of 20 μm after being dried.

The contrast between the printed portion and the underlayer was visually inspected, and evaluated based on the following standards:

○: Contrast between the printed portion and the test sample board is good, having excellent visibility.

Δ: Contrast between the printed portion and the test sample board is not clear, having poor visibility.

TABLE 1

| | Example | | | | | | | | Comparative Example | | | | | | | | |
|---|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 | 9 |
| Acrylate 1 | 30 | 30 | 30 | | 30 | | 30 | 30 | 30 | 30 | 30 | 30 | 30 | 30 | | 30 | 30 |
| Acrylate 2 | | | | 30 | | 30 | | | | | | | | | 30 | | |
| Acrylate 3 | 30 | 30 | 30 | | 30 | | 30 | 30 | 30 | 30 | 30 | 30 | 30 | 30 | | | |
| Acrylate 4 | 10 | 10 | 10 | 20 | 10 | 20 | 10 | 10 | 10 | 10 | 10 | 10 | 10 | 10 | 20 | | |
| Acrylate 5 | | | | 20 | | 20 | | | | | | | | | 20 | | |
| Photo-polymerization initiator 1 | 4 | 4 | 4 | 4 | 4 | 4 | 4 | 4 | 4 | 4 | 4 | 4 | | 4 | 4 | 4 | |
| Photo-polymerization initiator 2 | 3 | 3 | 3 | 3 | 3 | 3 | 3 | 3 | 3 | 3 | 3 | 3 | | 3 | 3 | 3 | |
| Isocyanate 1 | 20 | 10 | 3 | 10 | | | 10 | 10 | 1 | | | | 20 | | | | |
| Isocyanate 2 | | | | | 10 | 10 | | | | | | | | | | | |
| Isocyanate 3 | | | | | | | | | | | | | | | | 17 | 17 |
| Epoxy resin 1 | | | | | | | | | | 20 | 20 | | | | | | |
| Epoxy resin 2 | | | | | | | | | | | | 20 | | | | | |
| Epoxy curing agent 1 | | | | | | | | | | | 0.1 | | | | | | |
| Epoxy curing agent 2 | | | | | | | | | | | | 0.1 | 0.1 | | | | |
| Leveling agent | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| Dispersant | | | | | | | 0.5 | 0.5 | | | | | | | | | |
| Titanium oxide | | | | | | | 10 | | | | | | | | | | |
| Barium sulfate | | | | | | | | 10 | | | | | | | | | |
| Curing properties immediately after coating | ○ | ○ | ○ | ○ | ○ | ○ | ○ | ○ | ○ | x | x | x | x | ○ | ○ | ○ | x |
| Adhesion | ○ | ○ | ○ | ○ | ○ | ○ | ○ | ○ | x | ○ | ○ | ○ | ○ | x | x | ○ | ○ |
| Chemical resistance | ○ | ○ | ○ | ○ | ○ | ○ | ○ | ○ | x | ○ | ○ | Δ | ○ | x | x | ○ | ○ |
| Heat resistance | ○ | ○ | ○ | ○ | ○ | ○ | ○ | ○ | x | ○ | Δ | Δ | ○ | x | x | ○ | ○ |
| Insulating properties | ○ | ○ | ○ | ○ | ○ | ○ | ○ | ○ | — | — | — | — | ○ | — | — | ○ | — |
| Storage stability 1 | ○ | ○ | ○ | ○ | ○ | ○ | ○ | ○ | ○ | x | ○ | ○ | ○ | ○ | ○ | ○ | ○ |
| Storage stability 2 | ○ | ○ | ○ | ○ | ○ | ○ | ○ | ○ | ○ | Δ | ○ | ○ | ○ | ○ | ○ | x | x |

The resulting coating film was dried at 80° C. for 30 minutes, and exposed to a light of 300 mJ/cm² with a pattern of the entire surface of the coating film left on of the above-mentioned laminate. The laminate after exposure was subjected to development by using 1 wt % Na₂CO₃ at 30° C., and washed with water. Further, the coating film was cured at 150° C. for 30 minutes to prepare a test sample board.

An inkjet printer Dimatix Materials Printer DMP-2831 manufactured by Fujifilm Corporation was used. A spot UV irradiation machine was affixed to the printer by fixing the irradiation portion of the machine being secured to the side of a print head by use of an adhesive tape. Thus, an inkjet printer capable of UV irradiation simultaneously with coating was prepared.

This inkjet printer was charged with each of the compositions of Examples 2, 7, and 8 of the present invention, and alphabets A to E were printed on the test sample board in a size of 3 mm².

"-" in Table: not evaluated

The amount of the materials in Table is based on part(s) by weight.

Herein, materials listed in Table 1 are as follows.

Acrylate 1: trimethylolpropane triacrylate
M-309 produced by Toagosei Co., Ltd.

[Formula 1]

Acrylate 2: pentaerythritol triacrylate
PETRA produced by Daicel-Cytec Co., Ltd.

[Formula 2]

Acrylate 3: 1,6-hexanediol diacrylate
HDDA produced by Daicel-Cytec Co., Ltd.

[Formula 3]

Acrylate 4: butyl acrylate
n-butyl acrylate produced by Showa Chemical Co., Ltd.

[Formula 4]

Acrylate 5: 4-hydroxybutyl acrylate
4-HBA produced by Osaka Organic Chemical Industry Ltd.

[Formula 5]

Photo-polymerization initiator 1: Irgacure 907 produced by BASF Japan Ltd.
Photo-polymerization initiator 2: Irgacure 127 produced by BASF Japan Ltd.
Isocyanate 1: BI7982 produced by Baxenden Chemicals Ltd.
Trimer of 1,6-hexamethylene diisocyanate, blocked with dimethylpyrazole

Trimer of 1,6-hexamethylene diisocyanate

[Formula 7]

Dimethyl Pyrazole
Isocyanate 2: BI7992 produced by Baxenden Chemicals Ltd.
Trimer of 1,6-hexamethylene diisocyanate, blocked with dimethylpyrazole and diethyl malonate (active methylene compound)

[Formula 8]

Diethyl Malonate
Isocyanate 3: m-xylylene diisocyanate

[Formula 9]

Epoxy resin 1: allyl glycidyl ether, EX-111 produced by Nagase ChemteX Corporation
Epoxy resin 2: 1,6-hexanediol diglycidyl ether, EX-212 produced by Nagase ChemteX Corporation
Epoxy curing agent 1: 2-ethyl-4-methylimidazole, 2E4MZ produced by Shikoku Chemicals Corporation
Epoxy curing agent 2: 2-phenyl-4,5-dihydroxymethylimidazole, 2PHZ-PW produced by Shikoku Chemicals Corporation
Leveling agent: BYK-307 produced by BYK Japan KK

[Formula 6]

Dispersant: DISPERBYK-111 produced by BYK Japan KK

Titanium oxide: CR-95 produced by Ishihara Sangyo Kaisha, Ltd.

[Evaluations]

All the compositions of the present invention are excellent in curing properties immediately after coating, adhesion, chemical resistance, heat resistance, insulating properties, and storage stability. Such compositions are extremely preferable for application to a printed wiring board for which these properties are required.

With respect to the visibility, the contrast between the printed portion and test sample board was good having an excellent visibility in Example 7, where titanium oxide was used. On the other hand, the contrast between the printed portion and test sample board was not clear having insufficient visibility in Examples 2 and 8, where titanium oxide was not used. Even when no titanium oxide is used, however, the composition of the present invention is preferably used for application for which visibility is not required, for example, for application as a solder resist.

Herein, printing using an inkjet printer by the composition of the present invention was sequentially performed smoothly, and no change in the composition was observed even after application of heat to the printer.

III. Effect of Isocyanate on (Meth)Acrylate

[Measurement of DSC Data]

Figure 1:
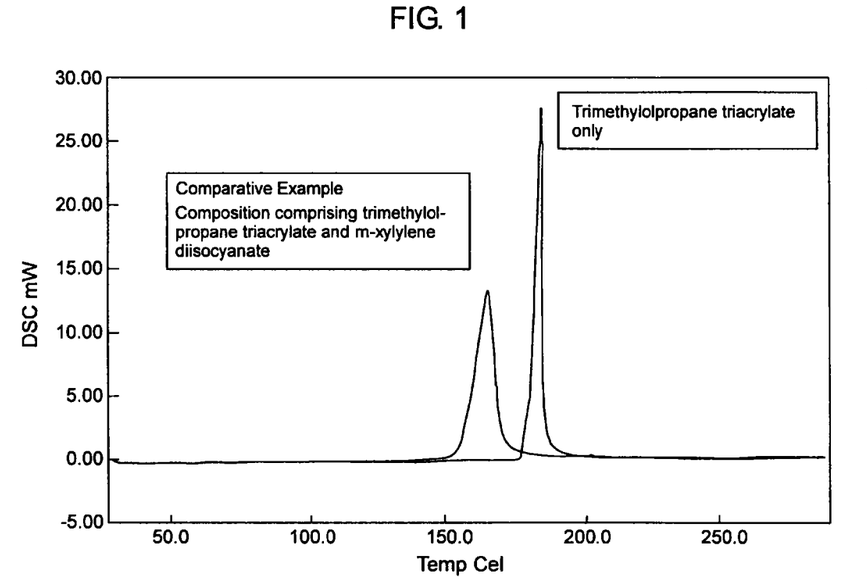
FIG. 1 is a diagram showing differential scanning calorimetric curves of a composition of the present invention and a material for comparison.

Trimethylolpropane as Acrylate 1 and the composition of Comparative Example 9 were subjected to differential scanning calorimetry (DSC) using EXSTAR manufactured by Seiko Instruments Inc. The resulting DSC curves are shown in FIG. 1.

As a result, it is observed that the exothermic peak of the composition of trimethylolpropane triacrylate and isocyanate (m-xylylene diisocyanate of Comparative Example 9 is shifted to a low temperature side, compared with the peak of trimethylolpropane triacrylate only. Therefore, the composition can be cured at a low temperature.

[Infrared Spectrophotometric Measurement]

The absorbance of the composition of Comparative Example 9 was measured by infrared spectroscopy (IR Spectroscopy) using Spectrum 100 manufactured by PerkinElmer Japan Co., Ltd. Herein, smiths Dura Sample IRII was used as a macro ATR unit.

This measurement was carried out with respect to two samples obtained by coating two KBr plates with the composition of Comparative Example 9a by using a spatula, i.e., one sample heated in the air at 80° C. for 30 minutes (Sample 1), and another sample heated in air at 150° C. for 30 minutes (Sample 2).

Figure 2:
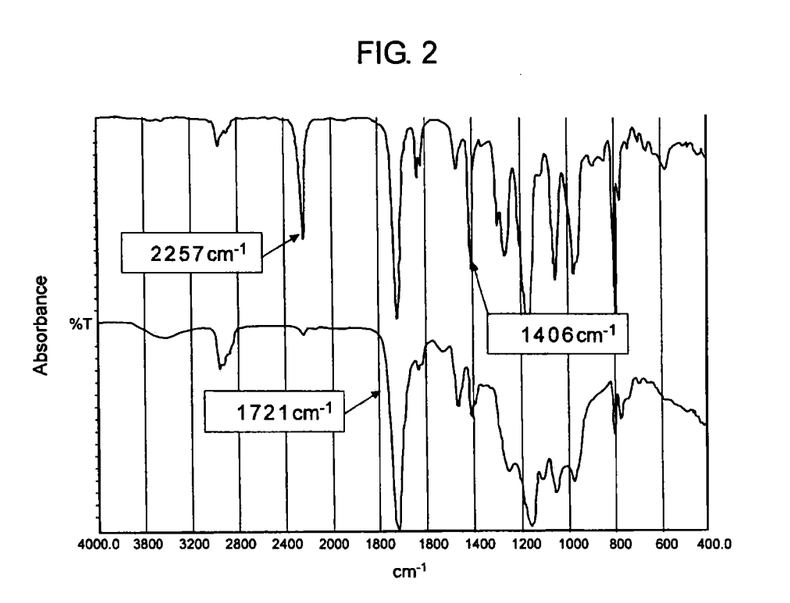
FIG. 2 is a diagram showing the change in absorbance observed by infrared spectroscopy by heating of the composition to different temperatures.

The IR chart obtained for Sample 1 is shown in the upper part of FIG. 2, and the IR chart obtained with respect to Sample 2 is shown in the lower part of FIG. 2.

When the IR chart of Sample 1 is compared with the IR chart of Sample 2, the peak around 2260 $cm^{-1}$, showing an isocyanate group, is remarkably found in the IR chart of Sample 1 (heated at 80° C.), but is significantly reduced in the IR chart of Sample 2 (heated at 150° C.).

Furthermore, the peak around 1406 $cm^{-1}$, showing an acryloyl group, is also remarkably shown in the IR chart of Sample 1 (heated at 80° C.), but is significantly reduced in the IR chart of Sample 2 (heated at 150° C.).

The above discussed result shows that isocyanate and an acryl group are consumed by heating.

In addition to the above, it is observed that the peak of carbonyl around 1721 $cm^{-1}$ is increased in the IR chart of Sample 2 (heated at 150° C.) more than that in the IR chart of Sample 1 (heated at 80° C.).

This indicates that isocyanate groups are trimerized to generate a carbonyl group.

It is considered, from the measurement results shown in FIG. 1 and FIG. 2, that isocyanates are trimerized by heating under the coexistence of isocyanate with acrylate, and that such a trimerization reaction results in polymerization of acrylate.

The invention claimed is:

1. A photocurable and thermally curable composition, comprising:
   a (meth)acryloyl group-containing monomer;
   a photo-polymerization initiator which initiates polymerization of the (meth)acryloyl group-containing monomer; and
   a block isocyanate comprising at least one trimer selected from the group consisting of a trimer of 1,6-hexamethylene diisocyanate and a trimer of isophorone diisocyanate in an amount in a range of 2 to 200 parts by weight based on 100 parts by weight of the (meth)acryloyl group-containing monomer.

2. The photocurable and thermally curable composition according to claim 1, wherein the (meth)acryloyl group-containing monomer comprises at least one polyfunctional (meth)acryloyl group-containing monomer and at least one monofunctional (meth)acryloyl group-containing monomer.

3. The photocurable and thermally curable composition according to claim 1, further comprising:
   a coloring pigment.

4. A cured product obtained by a process comprising:
   subjecting the photocurable and thermally curable composition according to claim 1 to pattern printing on a substrate by an inkjet printer to form a composition layer;
   irradiating a light to the composition layer to photo-cure the composition layer; and
   thermally curing the photo-cured composition layer by heating.

5. A printed wiring board, comprising:
   the cured product according to claim 4.

6. The photocurable and thermally curable composition according to claim 2, further comprising:
   a coloring pigment.

7. A cured product obtained by a process comprising:
   subjecting the photocurable and thermally curable composition according to claim 2 to pattern printing on a substrate by an inkjet printer to form a composition layer;
   irradiating a light to the composition layer to photo-cure the composition layer; and
   thermally curing the photo-cured composition layer by heating.

8. A cured product obtained by a process comprising:
   subjecting the photocurable and thermally curable composition according to claim 3 to pattern printing on a substrate by an inkjet printer to form a composition layer;
   irradiating a light to the composition layer to photo-cure the composition layer; and
   thermally curing the photo-cured composition layer by heating.

9. A printed wiring board, comprising:
   the cured product according to claim 7.

10. A printed wiring board, comprising:
the cured product according to claim 8.

11. The photocurable and thermally curable composition according to claim 1, wherein the block isocyanate trimer is blocked by at least one blocking agent selected from the group consisting of ethanol, n-propanol, isopropanol, t-butanol, isobutanol, phenol, chlorophenol, cresol, xylenol, p-nitrophenol, p-t-butylphenol, p-sec-butylphenol, p-sec-amylphenol, p-octylphenol, p-nonylphenol, 3-hydroxypyridine, 8-hydroxyquinoline, 8-hydroxyquinaldine, diethyl malonate, ethyl acetoacetate, acetylacetone, acetamide, acrylamide, acetanilide, succinimide, maleic imide, 2-ethylimidazole, 2-ethyl-4-methylimidazole, pyrazole, 3-methylpyrazole, 3,5-dimethylpyrazole, 2-pyrrolidone, ε-caprolactam, acetoxime, methyl ethyl ketone oxime, cyclohexanone oxime, acetaldoxime, ethyleneimine, and bisulfite.

12. The photocurable and thermally curable composition according to claim 1, wherein the block isocyanate trimer is blocked by at least one blocking agent selected from the group consisting of diethyl malonate, ethyl acetoacetate, acetyl acetone, pyrazole, 3-methylpyrazole, and 3,5-dimethylpyrazole.

13. The photocurable and thermally curable composition according to claim 2, wherein the monofunctional (meth)acryloyl group-containing monomer is included in an amount of from 10 to 400 parts by weight based on 100 parts by weight of the polyfunctional (meth)acryloyl group-containing monomer.

14. The photocurable and thermally curable composition according to claim 1, further comprising:
titanium oxide.

15. The photocurable and thermally curable composition of claim 1, wherein the trimer is a trimer of 1,6-hexamethylene diisocyanate blocked by at least one of diethyl malonate and 3,5-dimethylpyrazole.

16. The photocurable and thermally curable composition according to claim 2, wherein the block isocyanate trimer is blocked by at least one blocking agent selected from the group consisting of ethanol, n-propanol, isopropanol, t-butanol, isobutanol, phenol, chlorophenol, cresol, xylenol, p-nitrophenol, p-t-butylphenol, p-sec-butylphenol, p-sec-amylphenol, p-octylphenol, p-nonylphenol, 3-hydroxypyridine, 8-hydroxyquinoline, 8-hydroxyquinaldine, diethyl malonate, ethyl acetoacetate, acetylacetone, acetamide, acrylamide, acetanilide, succinimide, maleic imide, 2-ethylimidazole, 2-ethyl-4-methylimidazole, pyrazole, 3-methylpyrazole, 3,5-dimethylpyrazole, 2-pyrrolidone, ε-caprolactam, acetoxime, methyl ethyl ketone oxime, cyclohexanone oxime, acetaldoxime, ethyleneimine, and bisulfite.

17. The photocurable and thermally curable composition according to claim 2, wherein the block isocyanate trimer is blocked by at least one blocking agent selected from the group consisting of diethyl malonate, ethyl acetoacetate, acetylacetone, pyrazole, 3-methylpyrazole, and 3,5-dimethylpyrazole.

18. The photocurable and thermally curable composition according to claim 3, wherein the monofunctional (meth)acryloyl group-containing monomer is included in an amount of from 10 to 400 parts by weight based on 100 parts by weight of the polyfunctional (meth)acryloyl group-containing monomer.

19. The photocurable and thermally curable composition of claim 2, wherein the trimer is a trimer of 1,6-hexamethylene diisocyanate blocked by at least one of diethyl malonate and 3,5-dimethylpyrazole.

20. The photocurable and thermally curable composition of claim 18, wherein the trimer is a trimer of 1,6-hexamethylene diisocyanate blocked by at least one of diethyl malonate and 3,5-dimethylpyrazole.

21. The photocurable and thermally curable composition according to claim 18, wherein the block isocyanate trimer is blocked by at least one blocking agent selected from the group consisting of diethyl malonate, ethyl acetoacetate, acetylacetone, pyrazole, 3-methylpyrazole, and 3,5-dimethylpyrazole.

* * * * *